United States Patent
Martinez

(10) Patent No.: US 10,670,703 B2
(45) Date of Patent: Jun. 2, 2020

(54) DEVICE FOR DETECTING A LASER SPOT

(71) Applicant: SAFRAN ELECTRONICS & DEFENSE, Boulogne Billancourt (FR)

(72) Inventor: Alain Martinez, Boulogne Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 112 days.

(21) Appl. No.: 16/079,690

(22) PCT Filed: Feb. 24, 2017

(86) PCT No.: PCT/EP2017/005440
§ 371 (c)(1),
(2) Date: Aug. 24, 2018

(87) PCT Pub. No.: WO2017/148832
PCT Pub. Date: Sep. 8, 2017

(65) Prior Publication Data
US 2019/0049563 A1 Feb. 14, 2019

(30) Foreign Application Priority Data

Feb. 29, 2016 (FR) ..................................... 16 00330

(51) Int. Cl.
| | | |
|---|---|---|
| *G01S 7/4863* | (2020.01) | |
| *G01S 3/784* | (2006.01) | |
| *H03K 5/24* | (2006.01) | |
| *H03K 19/0175* | (2006.01) | |
| *H03K 19/173* | (2006.01) | |

(Continued)

(52) U.S. Cl.
CPC ............ *G01S 7/4863* (2013.01); *G01S 3/784* (2013.01); *H03K 5/2472* (2013.01); *H03K 19/017536* (2013.01); *H03K 19/1737* (2013.01); *G01J 11/00* (2013.01); *G01R 19/16528* (2013.01)

(58) Field of Classification Search
CPC ............................... G01S 7/4863; G01S 3/784
See application file for complete search history.

(56) References Cited

U.S. PATENT DOCUMENTS

| | | | |
|---|---|---|---|
| 2009/0079956 A1 | 3/2009 | Kennedy et al. | |
| 2016/0047911 A1* | 2/2016 | Yap ......................... | G01S 17/06 250/206.1 |

FOREIGN PATENT DOCUMENTS

| | | |
|---|---|---|
| EP | 2 759 848 A1 | 7/2014 |
| JP | 2005 326340 A | 11/2005 |
| WO | WO 2011/029651 A1 | 3/2011 |

* cited by examiner

*Primary Examiner* — Thanh Luu
(74) *Attorney, Agent, or Firm* — Muncy, Geissler, Olds & Lowe, P.C.

(57) ABSTRACT

Laser spot detecting device including a plurality of elementary optoelectronic detectors that are each connected to an elementary pulse detecting circuit, each elementary pulse detecting circuit including a comparator and a memory module that is connected to one output of the comparator, the memory modules being connected to a multiplexing circuit having an output forming a digital spatial output of the laser spot detecting device. The laser spot detecting device further more includes a global OR circuit having inputs connected to the outputs of the comparators and having an output forming a real-time digital temporal output of the laser spot detecting device. Method for detecting a laser spot implemented by such a detecting device.

12 Claims, 4 Drawing Sheets

(51) Int. Cl.
*G01J 11/00* (2006.01)
*G01R 19/165* (2006.01)

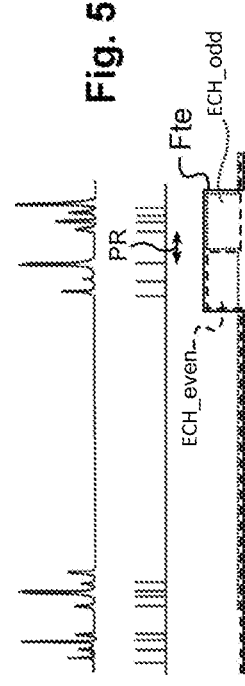
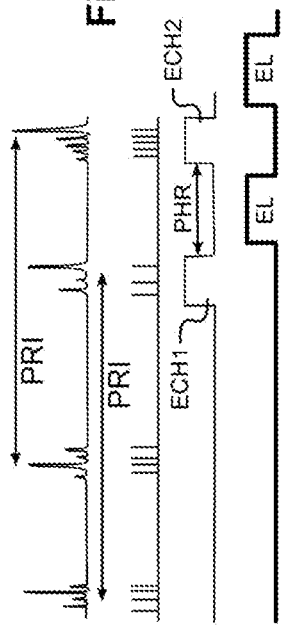
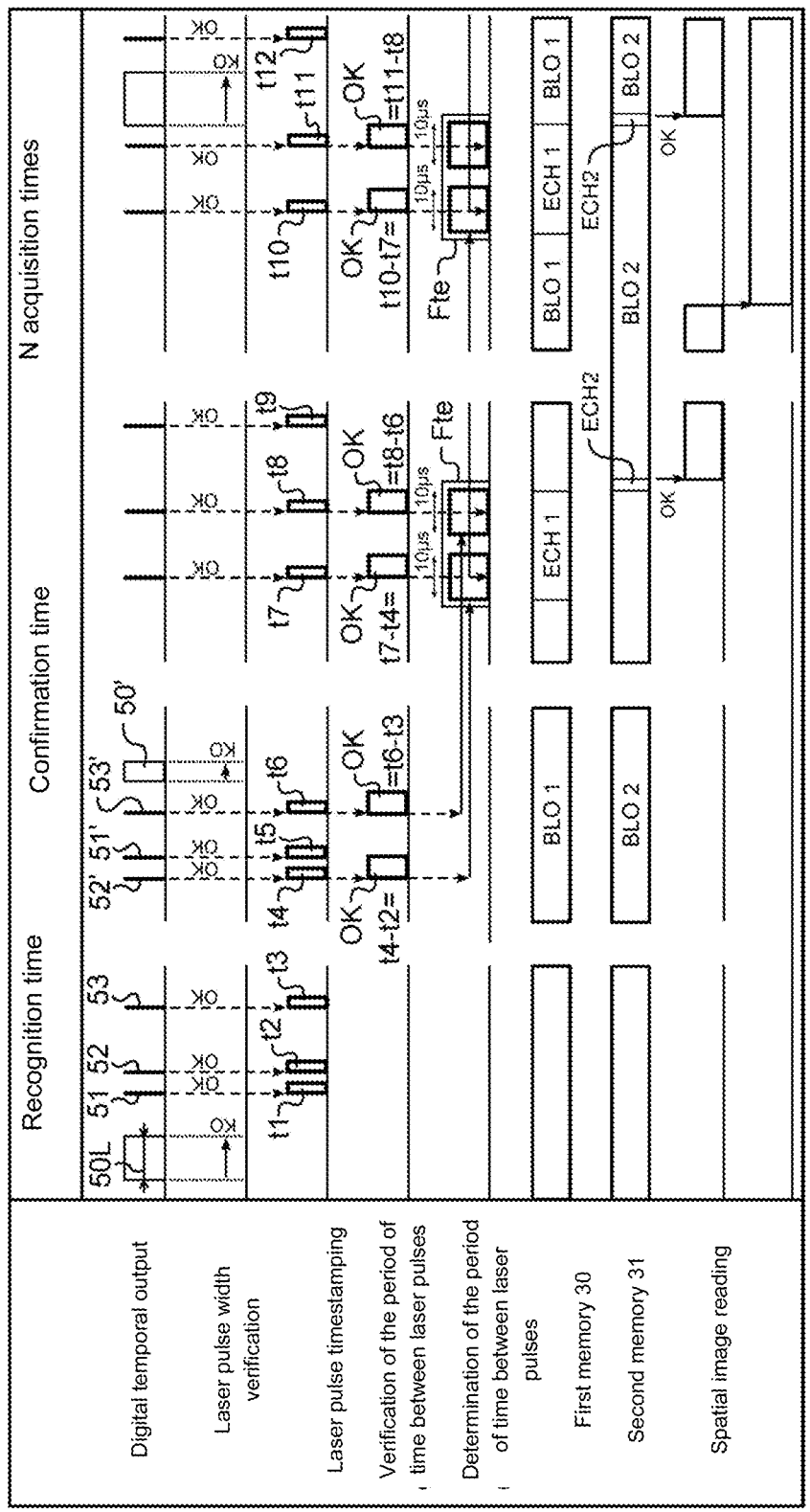

DEVICE FOR DETECTING A LASER SPOT

The present invention relates to the field of matrix optical sensors for detecting a laser spot projected into the field of a sensor.

BACKGROUND OF THE INVENTION

Matrix optical sensors comprising a plurality of elementary optoelectronic detectors, commonly called pixels, connected to a charge coupled circuit having an spatial output are known.

Such a matrix optical sensor makes it possible to accurately determine the position of the laser spot in the field covered by the matrix optical sensor but does not make it possible to determine time parameters associated with the laser pulse having caused the laser spot (duration of the laser pulse, period of time between two successive laser pulses, etc.).

Now, in some applications, time parameters are used to identify the emitter of the laser pulse.

To obtain such time parameters, it has been considered to associate with the matrix optical sensor an additional external single-element sensor, such as a photodiode associated with an electronic amplification and thresholding circuit, which covers the same field as the matrix sensor and which is dedicated to the measurement of the time parameters. This solution however is not optimal.

PURPOSE OF THE INVENTION

One object of one invention is to provide time parameters associated with a laser pulse having generated a laser spot in the field of a matrix optical sensor, in addition to the detection of the laser spot position in the field of the matrix optical sensor.

BRIEF SUMMARY OF THE INVENTION

For this purpose, the invention provides for a laser spot detecting device comprising a matrix optical sensor comprising a plurality of elementary optoelectronic detectors that are each connected to an elementary pulse detecting circuit, with each elementary pulse detecting circuit comprising a comparator for comparing with a threshold an electrical amount depending on an output current of the elementary optoelectronic detector applied to one input of the comparator and a memory module that is connected to one output of the comparator, with the memory modules being connected to a multiplexing circuitry having an output forming a digital spatial output of the laser spot detecting device. The laser spot detecting device furthermore includes a global OR circuit having inputs connected to the outputs of the comparators and having an output forming a real-time digital temporal output of the laser spot detecting device.

Such real-time temporal output will make it possible to analyze or to discriminate the received laser pulses before using the spatial output for reading the positions thereof. The "real time" global OR circuit, which replaces the additional external single-element sensor, has a number of advantages. A background current, resulting from a background light noise, is divided by the total number of elementary optoelectronic detectors (pixels) in comparison with the additional external single-element sensor. Similarly, the capacitance of each of the elementary optoelectronic detectors representing an area equivalent to that of the additional external single-element sensor is divided, relative to that of the additional external single-element sensor, by the total number of elementary optoelectronic detectors. The noise produced by a current-voltage converter of each elementary pulse detecting circuit is reduced, and the response speed of said current-voltage converter is increased. Besides, the implementation of the global OR circuit requires no addition of any additional component and does not require to implement an optical path. The digital temporal output can also benefit from the same performances as a conventional spatial output.

Other characteristics and advantages of the invention will become apparent upon reading the following description of particular non-restrictive embodiments of the invention.

BRIEF DESCRIPTION OF THE FIGURES

Reference is made to the appended drawings, wherein:

FIGS. 4 and 5 are figures similar to FIG. 3, when a decoy laser spot has been detected in addition to the target laser spot;

FIG. 6 is a timing chart similar to that of FIG. 2, when a decoy laser spot has been detected in addition to the target laser spot;

DETAILED DESCRIPTION OF THE INVENTION

The invention relates to a laser spot detecting device intended to detect, identify and locate a laser spot via detection and analysis of laser pulses having generated the laser spot.

The laser spot detecting device according to the invention can in particular be integrated into a semi-active laser guidance system (for guiding a missile, for instance).

The structure of a laser spot detecting device 0 according to a first embodiment of the invention will first be described.

Figure 1:
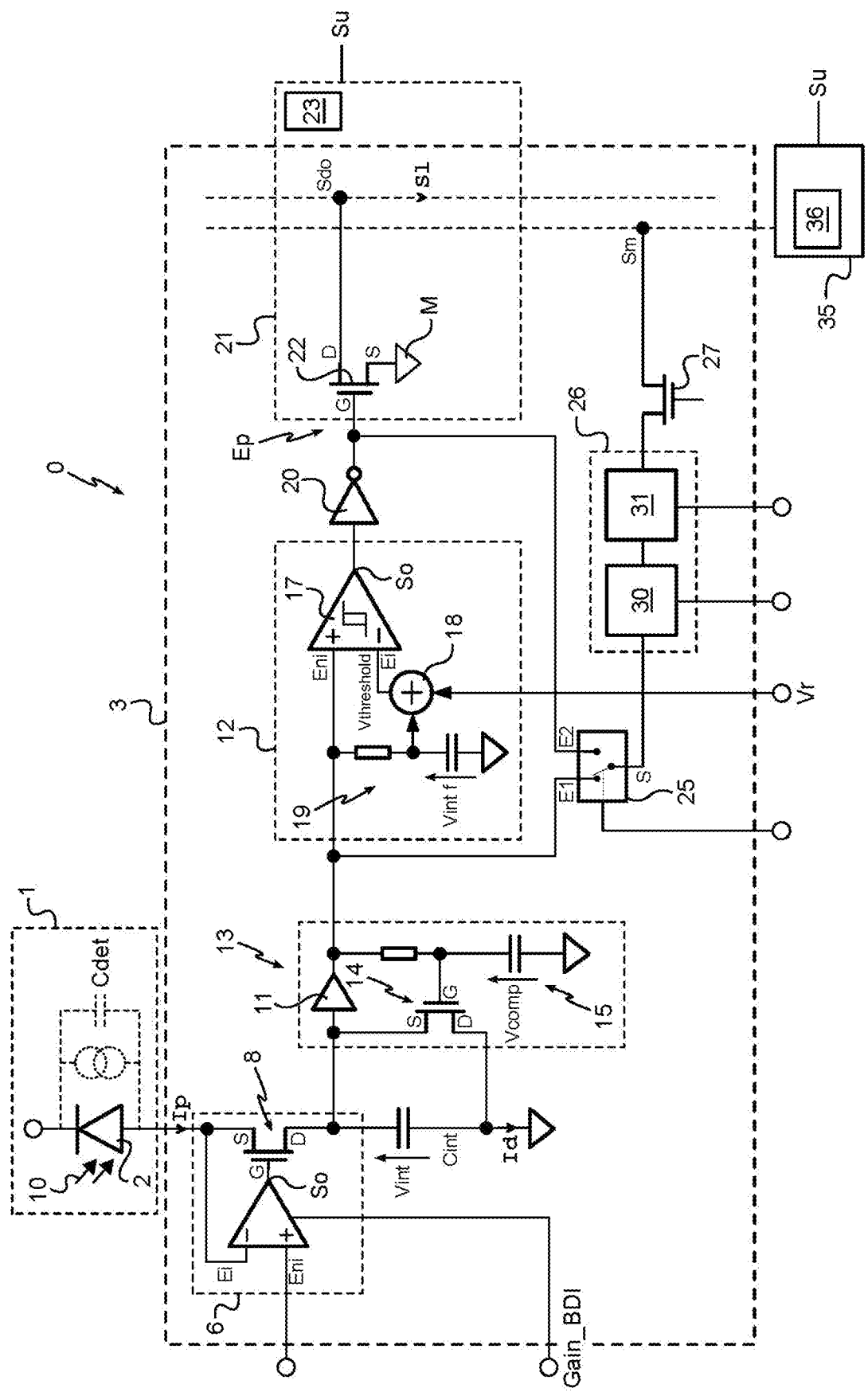
FIG. 1 shows a wiring diagram of a laser spot detecting device according to a first embodiment of the invention.

Referring to FIG. 1, the laser spot detecting device 0 comprises a matrix optical sensor having a plurality of elementary optoelectronic detectors 1, commonly called pixels, and arranged in rows and columns. The laser spot detecting device 0 also comprises processing means which comprise here a processing component, here a micro-controller (another processing component, such as a FPGA, could be used instead of, or in addition to the microcontroller). The processing means control the operation of the laser spot detecting device 0 and, in particular, acquire and analyze the various signals produced by the elementary optoelectronic detectors 1 of the matrix optical sensor.

Each elementary optoelectronic detector 1 includes a photodiode 2 which can be modelized by a current source in parallel with a capacitance Cdet.

The elementary optoelectronic detectors 1 are each connected to an elementary pulse detecting circuit 3.

The basic circuit detection pulse 3 is a circuit of the "Buffered Direct Injection" type.

The elementary pulse detecting circuit 3 thus comprises a buffered direct injection block 6 which comprises an amplifier 7 and a first MOSFET transistor 8. One output of the amplifier 7 is connected to a gate G of the first MOSFET transistor 8. An inverting input Ei of the amplifier 7 is connected to a source S of the first MOSFET transistor 8, with the source S also being connected to the anode of the photodiode 2.

The buffered direct injection block 6 implements feedback control which makes it possible to reduce the input impedance of the first MOSFET transistor 8 and to improve the control of the photodiode 2 polarization. The impedance variations of the capacitance Cdet are thus limited, the current injection is more effective and the detection bandwidth is relatively large.

The elementary pulse detecting circuit 3 further comprises an integration capacitance Cint connected to a drain D of the first MOSFET transistor 8. The integration capacitance Cint is adapted to integrate a photocurrent Ip generated by the photodiode 2 and resulting from an incident light radiation 10 reaching the photodiode 2.

The capacitance value of the integration capacitance Cint is significantly less than the capacitance value of the capacitance Cdet, and thus the current-voltage conversion gain of the elementary pulse detecting circuit 3 is relatively large.

It should be noted that the current-voltage conversion gain is here a variable gain with very high dynamics which ensures an effective detection under variable conditions, for example between the beginning and the end of a mission aiming at detecting, identifying and locating the laser spot.

The detection of laser pulses in the incident light radiation 10 consists in operating, at equal and regular intervals in a predetermined integration period of time, an integration voltage Vint at the terminals of the integration capacitance Cint. The integration voltage Vint results from the integration of the photocurrent Ip by the integration capacitance Cint. Thanks to the relatively large current-voltage conversion gain mentioned earlier, the integration voltage Vint is sufficiently high to enable detecting the presence or the absence, in the photocurrent Ip, of a current pulse representative of a laser pulse.

Operating the integration voltage Vint consists in comparing the voltage integration Vint at the terminals of the integration capacitance Cint with a reference voltage threshold Vthreshold. As a matter of fact, the presence in the photocurrent Ip, of a current pulse representative of a laser pulse during an integration period of time will generate a slight increase in the integration voltage Vint, with said slight increase being detected by comparison with the reference voltage threshold Vthreshold. The comparison is performed by comparing means 12 which will be described hereunder.

However, the integration capacitance Cint has to be discharged regularly, so that a detected increase in the integration voltage Vint really matches a current pulse representative of a laser pulse, and not charge build-up in the integration capacitance Cint resulting from the integration of the photocurrent Ip during the previous integration period of times.

The elementary pulse detecting circuit 3 comprises for this purpose discharge means 13 adapted to continuously discharge the integration capacitance Cint, i.e. the discharge means 13 are continuously operated and not only upon completion of an integration period of time, for instance.

The discharge means 13 comprise a second MOSFET transistor 14, a source S and a drain D of which are connected to the terminals of the integration capacitance Cint and a gate G of which is connected to a discharge low pass filter 15. The source S is isolated by a voltage follower 11 (which is an isolation amplifier having a high input impedance). The discharge low pass filter 15 is connected to the integration capacitance Cint. The discharge low-pass filter 15 is here an RC filter.

The discharge low pass filter 15 makes it possible to produce a compensation voltage Vcomp. The compensation voltage Vcomp is a component of the voltage Vint which results from the presence of a background noise current in the photocurrent Ip. The background noise current is generated by the photodiode 2 and comes from a background light noise present in the incident light radiation 10. The compensation voltage Vcomp corresponds to the integration voltage Vint from which one component resulting from a current pulse generated by a laser pulse has been removed by the discharge low pass filter 15.

Applying the compensation voltage Vcomp to the gate G of the second MOSFET transistor 14 makes it possible to generate a discharge current Id close to the background noise current which continuously discharges the integration capacitance Cint.

A high pass filtering is thus implemented by performing a "retro-injection" of the discharge current Id generated by the discharge low pass filter 15.

The discharge means 13 thus make it possible to automatically discharge the integration capacitance Cint, and also to avoid the saturation of the buffered direct injection block 6 and the integration capacitance Cint without having to implement a complex regulation to avoid such saturation.

The comparison means 12 then compare the integration voltage Vint with the reference voltage threshold Vthreshold. The comparison means 12 comprise a comparator 17, an adder 18 and a detection low pass filter 19. The detection low pass filter 19 is here an RC filter.

The low pass filter 19 filters the signal Vint at the outlet of the voltage follower 11 and is intended to filter the integration voltage Vintf to obtain an integration voltage Vintf having filtered components resulting from high frequency light pulses.

The filtered integration voltage Vint, as the compensation voltage Vcomp, thus corresponds to the integration voltage Vint from which a component resulting from a current pulse generated by a laser pulse has been removed.

The adder 18 adds a controllable voltage threshold Vr to the filtered integration voltage Vintf to obtain the reference voltage threshold Vthreshold. The controllable voltage threshold Vr can be controlled externally and collectively for all the pixels of the detection matrix. The controllable voltage threshold Vr is so controlled that, for each pixel, the reference voltage threshold Vthreshold is sufficiently above the level of the background noise to avoid generating false alarms. The controllable voltage threshold Vr is controlled using a single control voltage for all the pixels, either once per test, when developing the detection matrix, or continuously by the processing means of the laser spot detecting device 0.

The reference voltage threshold Vthreshold is thus a self-adaptive threshold that depends on the level of the background light noise present in the incident light radiation 10.

The integration voltage Vint is applied to a non inverting input Eni of the comparator 17. The reference voltage threshold Vthreshold is applied to an inverting input Ei of the comparator 17. The comparator 17 compares the integration voltage Vint with the reference voltage threshold Vthreshold.

When the integration voltage Vint is above the reference voltage threshold Vthreshold, the comparator produces at its output So a digital signal equal to "1". When the integration voltage Vint is smaller than or equal to the reference voltage threshold Vthreshold, the comparator produces at its output So a digital signal equal to "0".

In addition, the elementary pulse detecting circuit 3 comprises a NOT gate 20 which is connected to the output of the comparator 17. When the comparator 17 produces at its output So a digital signal equal to 1, the output of the NOT gate 20 is 0, and when the comparator 17 produces at its output So a digital signal equal to 0, the output of the NOT gate 20 is 1.

The laser spot detecting device 0 further comprises a global OR circuit 21.

The global OR circuit 21 has a plurality of inputs Ep and one single output Su, and comprises a plurality of third "open drain" MOSFET transistors 22 as well as additional components 23.

Each input Ep of the global OR circuit 21 is connected to the output of the NOT gate 20 of an elementary pulse detecting circuit 3.

Each third MOSFET transistor 22 is located in an elementary pulse detecting circuit 3.

In each elementary pulse detecting circuit 3, the output of the NOT gate 20 is connected to a gate G of the third MOSFET transistor 22. A source S of the third MOSFET transistor 22 is connected to a ground M of the elementary pulse detecting circuit 3. A drain D of the third MOSFET transistor 22 forms an open drain output Sdo of the elementary pulse detecting circuit 3.

All the open drain outputs Sdo (and thus all the drains D of the third MOSFET transistor 22) of the elementary pulse detecting circuits 3, in turn connected to elementary optoelectronic detectors 1 positioned on the same line of the matrix detector, are connected together for summing said open drain outputs Sdo and thereby form a line signal S1.

The additional components 23 of the global OR circuit 21 are so arranged as to buffer each signal line Si in turn, to sum all the line signals S1, and to apply the resulting signal onto the single output SU of the global OR circuit 21.

The single output Su of the global OR circuit 21 is thus a digital temporal output of the laser spot detecting device 0.

Each elementary pulse detecting circuit 3 additionally comprises a selector 25, a memory module 26 and a fourth MOSFET transistor 27.

The memory module 26 here comprises a first memory 30 and a second memory 31. The first memory 30 and the second memory 31 here each comprise a sample and hold component.

The selector 25 has a first input E1, a second input E2 and an output S. The selector 25 is controlled by the processing means of the laser spot detecting device 0.

The first input E1 of the selector 25 is connected to the non inverting input Eni of the comparator 17, to which is applied the integration voltage Vint, which is an analog voltage representative of current pulses from the laser pulses. Reference shall be made, in the following description to "analog laser pulses" to designate the analog voltage representative of current pulses from the laser pulses detected by the laser spot detecting device 0.

As for the second input E2 of the selector 25, it is connected to the NOT gate 20, in turn connected to the output So of the comparator 17, on which a digital signal representative of the presence (or the absence) of laser pulses is generated. Reference will be made, in the following description, to "digitized laser pulses" to designate the digital signal representative of the presence (or the absence) of laser pulses.

The output S of the selector 25 is connected to one input of the first memory 30. The selector 25 can thus be controlled by the processing means of the laser spot detecting device 0 for selectively connecting the non inverting input Eni of the comparator 17 to the input of the first memory 30 or the output So of the comparator 17 to the input of the first memory 30.

One output S of the first memory 30 is connected to one input of the second memory 31.

Thus, when the value stored by the second memory 31 is being read, the first memory 30 is available for storing a new value.

The output of the second memory 31 is connected to the fourth MOSFET transistor 27, which is in turn connected to a mixed output Sm of the elementary pulse detecting circuit 3.

The set of mixed outputs Sm of the elementary pulse detecting circuits 3 connected to all the set of elementary optoelectronic detectors 1 of each line and of each column of the matrix detector is connected to a multiplexing circuit 35.

The multiplexing circuit 35 includes an amplifier 36 and a single output Su connected to a single pin connected to the amplifier 36, which thus constitutes a digital spatial output of the laser spot detecting device when the selector 25 is controlled to connect the output So of the comparator 17 to the input of the first memory 30, or which is an analog spatial output of the laser spot detecting device 0 when the selector 25 is controlled to connect the non-inverting input Eni of the comparator 17 to the input of the first memory 30.

It should be noted here that the two sample and hold circuits of the first memory 30 and the second memory 31, which each form a "1 bit" memory have a smaller footprint than what would be a double "1 bit" memory required if each elementary pulse detecting circuit 3 included a digital output and a separate analog output (and not a mixed analog or digital output according to the control of the selector 25).

We will now describe the role played by the digital temporal output, the digital spatial output and the analog spatial output of the laser spot detecting device 0.

The digital temporal output makes it possible to carry out in real time and continuously a temporal analysis of the digitized laser pulses. Such temporal analysis of the digitized laser pulses is here carried out by the micro-controller of the processing means of the laser spot detecting device 0.

The temporal analysis consists in verifying if the width of a digitized laser pulse and if the period of time between two consecutive digitized laser pulses are in accordance with the ones expected.

Such temporal analysis makes it possible to differentiate the valid digitized laser pulses and the invalid digitized laser pulses.

The valid digitized laser pulses match laser pulses generating a so-called "target laser spot". A target laser spot is a laser spot generated by an "ally" of the user of the laser spot detecting device 0, that the latter is specifically designed to detect.

As for parasitic digitized laser pulses, they correspond to echoes of the target laser spot, specular highlights, a back scattering of the target laser spot at the end of the trajectory in atmosphere, or still a so-called "decoy laser spot". A decoy laser spot is a spot generated not by an ally but by an enemy of the user of the laser spot detecting device 0, in order to simulate a target laser spot to deceive said user.

When the width of a digitized laser pulse and the period of time between two consecutive digitized pulses are in accordance with the ones expected, the processing means (micro-controller or FPGA) of the laser spot detecting device 0 generates a spatial image and read said spatial image.

The digital spatial output and the analog spatial output can both be used to spatially represent the pixel(s) which has/have detected one or more laser spot(s) and thus to generate the spatial image which makes it possible to determine the position of one or more laser spot(s) which has/have been detected by the laser spot detecting device 0.

The digital spatial output produces a digital spatial image of the pixels, while the analog spatial output produces an analog spatial image of the pixels.

The analog spatial output also makes it possible, when several digitized laser pulses have a consistent width and consistent duration between two consecutive digitized pulses, to perform radiometry discrimination which makes it possible to differentiate the valid digitized laser pulses and the parasitic digitized laser pulses.

It should be noted that it is possible to use double sample and hold circuits for storing the laser pulses either digital or analog, so with the same circuit for both types.

A first concrete example and a second concrete example will now illustrate the implementation of a method for detecting a laser spot by a laser spot detecting device 0.

Figure 2:
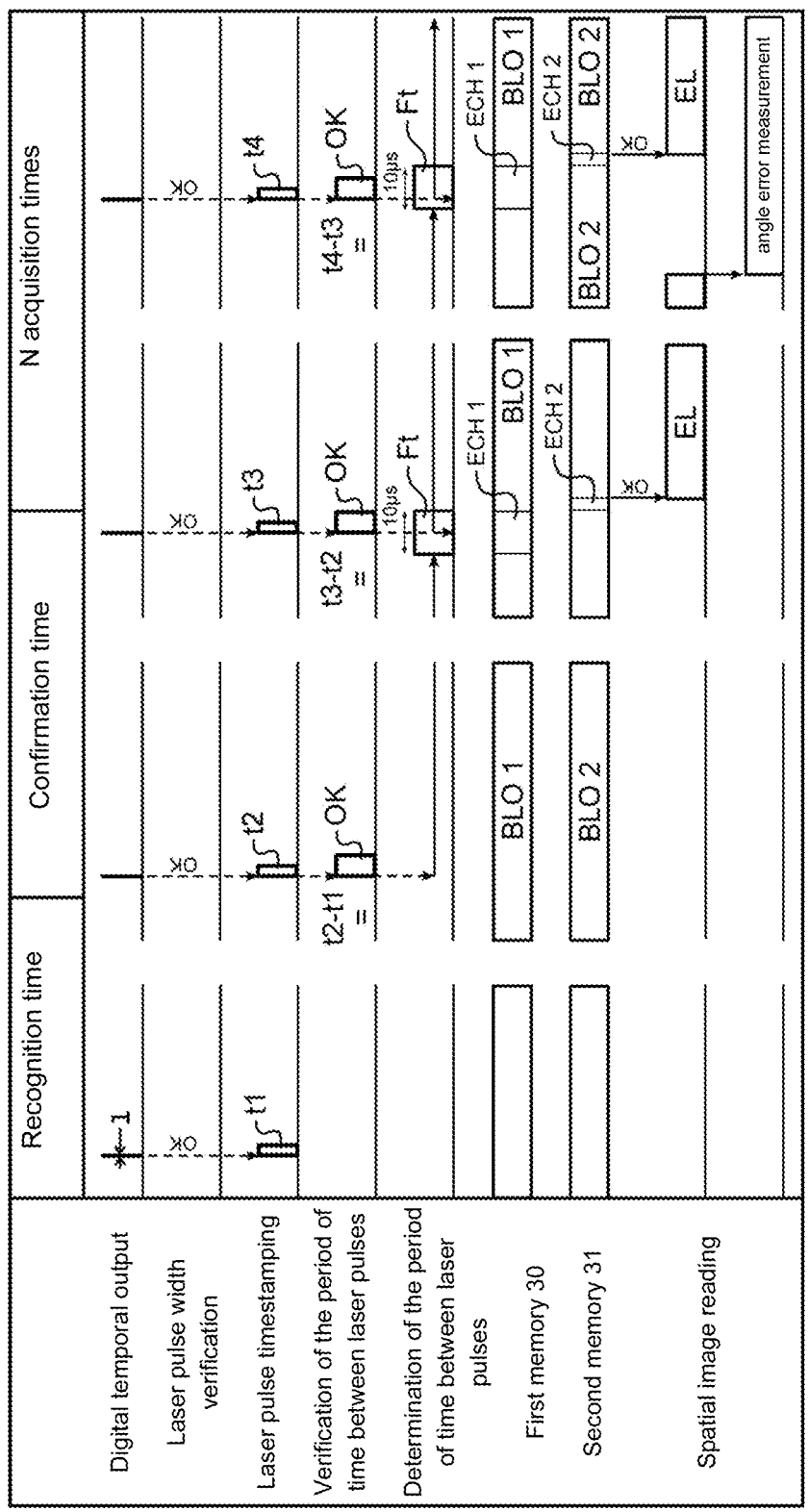
FIG. 2 is a time chart showing steps of a method for detecting a laser spot using the laser spot detecting device according to the invention, whereas a target laser spot has been detected.

The first concrete example is illustrated with reference to FIGS. 2 and 3.

Implementing the detection method first comprises a recognition time, during which the laser spot detecting device 0 detects a digitized pulse on the digital temporal output. The width 1 of the digitized pulse is checked and here corresponds to the width of a laser pulse which may have generated the target laser spot. The time of occurrence of the digitized laser pulse is dated and is timestamped t1.

Then, a next digital pulse is detected, and the width of the next digitized pulse is checked. The time of occurrence of the next digitized laser pulse is dated and is timestamped t2.

The duration t2−t1 is calculated. The duration t2−t1 corresponds to a Pulse Repetition Interval (PRI) associated with the target laser spot. It shall then be noted that t2−t1=PRI.

Implementing the detection method then comprises a confirmation time. The laser spot detecting device according to the invention attempts to detect the digitized laser pulses at time t3 such that t3−t2=t2−t1=PRI.

A digital laser pulse at time t3 is detected. The width of the digitized laser pulse at time t3 is verified and corresponds once again to the width of a laser pulse which may have generated the target laser spot.

Further to such checks, the acquisition of spatial images can start. Implementing the detection method thus comprises a succession of "N" periods of acquisition of spatial images.

Figure 3:
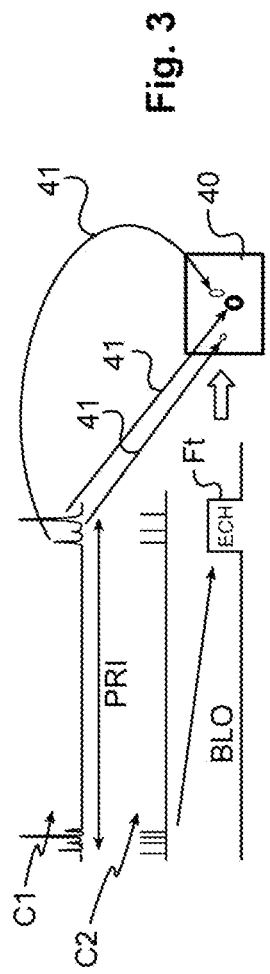
FIG. 3 shows laser pulses obtained by an elementary pulse detecting circuit of the laser spot detecting device according to the first embodiment of the invention upon implementing the method of FIG. 2.
Figure 7:
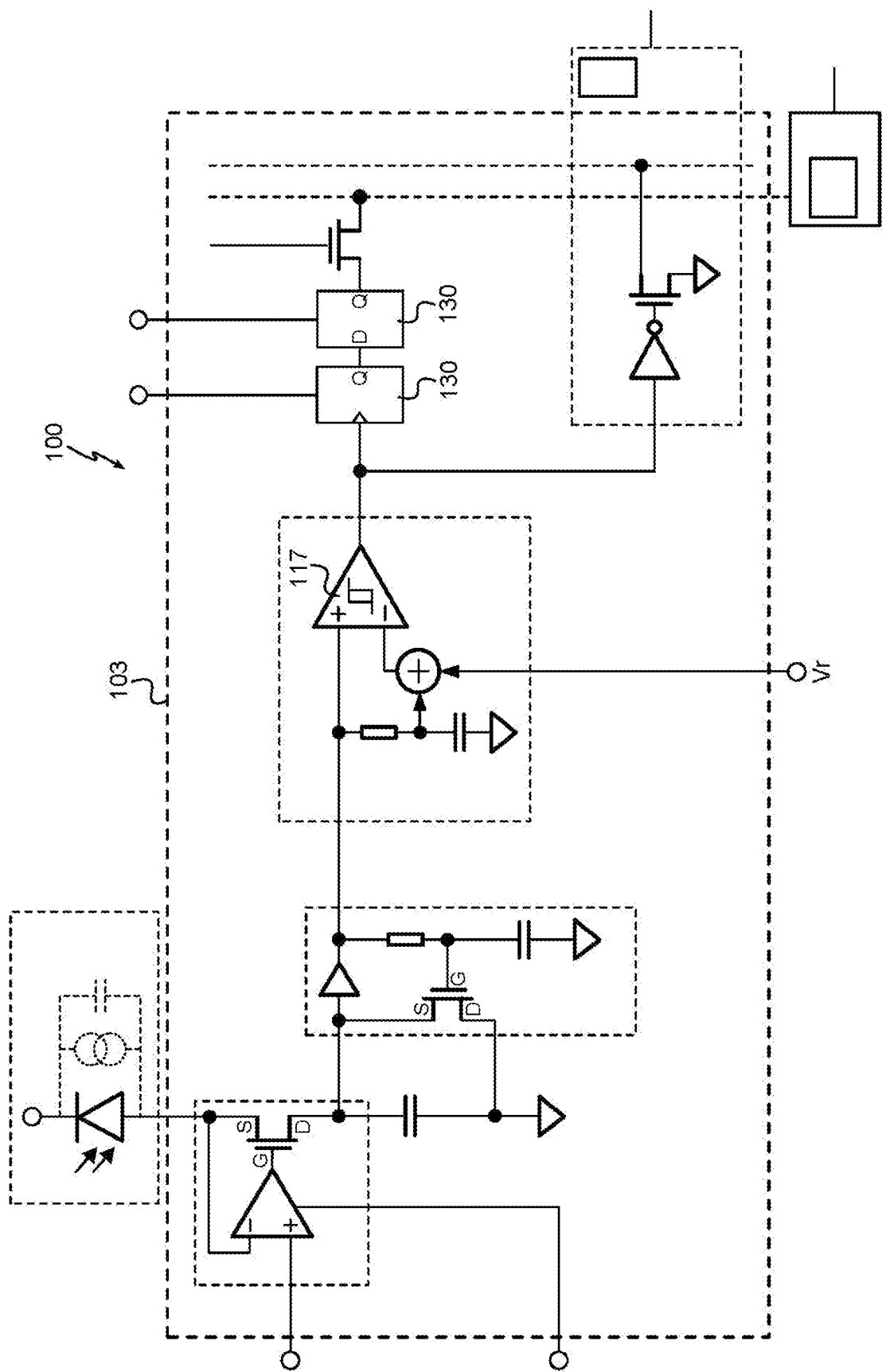
FIG. 7 shows a wiring diagram of a laser spot detecting device according to a second embodiment of the invention.

Referring to FIG. 3, at each time tn (here, N≥n≥3), a group of analog laser pulses is present on the analog spatial output (curve C1 in FIG. 3), which corresponds to a group of digitized laser pulses on the digital temporal output (curve C2 in FIG. 3).

Each group of analog laser pulses comprises a plurality of peaks, among which some are due to echoes or back-scattering of the target laser spot at the end of trajectory in the atmosphere.

The analog spatial output is used to differentiate the various peaks by radiometry and for positioning the various peaks for producing the spatial image 40. In FIG. 3, the arrows 41 indicate the position of each peak 40 in the corresponding spatial image.

The peak corresponding to the laser pulse having generated the target laser spot is here the one having the largest amplitude.

The processing means of the laser spot detecting device 0 acquire the peak amplitudes of the groups of analog laser pulses by integration through a sampling ECH carried out during the time slots Ft the width of which, at the time tn, is determined at the time tn−1, with the period of time between the time tn−1 and the time tn being equal to PRI.

Here the width of a time slot Ft is typically 10 µs, in order to take account of maximum litter of +/−5 ps which corresponds to a conventional value for the maximum jitter in an illuminator of the STANAG 3733 type.

If the analysis of the digital temporal output shows, at the time tn−1, that the group of laser pulses extends over a period of time greater than the width of the time slot Ft, the time slot Ft at the time tn will be adapted accordingly to take real account of all the peaks.

Prior to the sampling corresponding to any time tn, the sample and hold circuit of the first memory 30 is in locking mode BL01 and the sample and hold circuit of the second memory 31 is in locking mode BL02 (i.e. the first memory 30 and the second memory 31 are in a permanent reset condition).

Then, at the time of the occurrence of the laser pulse group, the sample and hold circuit of the first memory 30 switches to the sampling mode ECH1 for the duration of the time slot Ft.

The second memory 31 then switches, in turn, to the sampling mode ECH2, and the value stored in the first memory 30 is quickly transferred to the second memory 31. The second memory 31 is then used for reading a spatial image corresponding to the time tn. The first memory 30 becomes available again for the next integration and thus for the production of a next spatial image corresponding to the time tn+1.

The processing means of the laser spot detecting device 0 sequentially read the second memories 31 of all the elementary pulse detecting circuits 3 during a reading step EL, so as to produce a complete spatial image corresponding to the time tn. The process is repeated for all the times tn corresponding for example to the duration of a mission.

Two consecutive spatial images (i.e. corresponding to spatial images at the time tn−1 and at the time tn) are also used to implement an estimate of angle error measurement.

The second concrete example is a more complex case, wherein two elementary optoelectronic detectors 1 (two pixels) of the laser spot detecting device 0 detect laser pulses such that a period of time between two consecutive laser pulses complies with an expected duration.

The detected laser pulses are pulses having generated a target laser spot and pulses having generated a decoy laser spot.

Two cases may then occur.

In a first case, shown in FIG. 4, the laser pulses relative phase PHR, i.e. the period of time between two consecutive digitized laser pulses corresponding, for one, to the target laser spot and for the other to the decoy laser spot, has a duration greater than the duration of a step of reading EL.

Thus, the period of time between two groups of consecutive digitized laser pulses time (or more precisely the period of time between two consecutive time slots Ft used one for integrating the peaks of the group of pulses corresponding to the target laser spot and the other one for integrating the peaks of the group of pulses corresponding to the decoy laser spot) is large enough to enable reading a complete spatial image.

In this case, the laser spot detecting device 0 can read, between two separate samplings ECH1 and ECH2, the second memories 31 of the elementary pulse detecting circuits 3 of all the elementary optoelectronic detectors so as to determine which elementary optoelectronic detectors 1 the digitized laser pulses correspond to. The spot laser detecting device 0 thus reproduces and reads a valid complete spatial image.

In a second case, shown in FIG. 5, the laser pulses relative phase PR, i.e. the period of time between two consecutive laser pulses corresponding, for one, to the target laser spot and for the other to the decoy laser spot, does not make it possible to read a complete spatial image.

Several solutions can then be considered.

The first solution consists in using a wider time slot Fte to include laser pulses into one single spatial image. The spot laser detecting device 0 then uses the analog spatial output and implements an analysis by radiometry, or uses the spatial coherence of the trajectories to associate the laser pulses to the corresponding pixels and produce a valid complete spatial image.

The second solution consists in alternating the implementation of sampling between the pulse detecting circuits 3 of the two elementary optoelectronic detectors 1 concerned.

Thus, at the times tn, such that n is even (i.e. tn corresponds to an even multiple of PRI), a sampling ECH_pair is performed in the elementary detecting circuit 3 connected to one of the two elementary optoelectronic detectors 1 concerned, and at the times to such that n is odd (i.e. a sampling ECH_pair is performed in the elementary detecting circuit 3 connected to the other one of the two elementary optoelectronic detectors 1 concerned. The output of the elementary pulse detecting circuits 3 of each elementary optoelectronic detector 1 concerned is thus read every second PRI. If the two elementary optoelectronic detectors 1 are far enough apart in the spatial image, the laser spot detecting device 0 will be able to implement a sampling over a greater time slot Fte and discriminate between the two elementary optoelectronic detectors 1 concerned due to their spatial separation.

Eventually, when the laser spot detecting device 0 has determined which elementary optoelectronic detector 1 has detected the valid laser pulse, the laser spot detecting device 0 can simply implement a sampling in the elementary pulse detecting circuit 3 of this elementary optoelectronic detector 1 only.

If the decoy laser spot is perfectly synchronized with the target laser spot, it may be impossible to temporally separate the two samplings. A sampling is then performed on an enlarged time slot Fte. The laser pulses are integrated into one single spatial image. The laser spot detecting device 0 then uses the analog spatial output and implements an analysis by radiometry, or uses the spatial coherence of the trajectories to associate the laser pulses with the corresponding pixels and produce a valid spatial image.

The first solution is illustrated in the time chart of FIG. 6.

Implementing the detection method first comprises a recognition period during which the laser spot detecting device 0 detects, through the digital temporal output, a first digitized pulse 50, a second digitized pulse 51, a third digitized pulse 52 and a fourth digitized pulse 53.

The width of each digitized laser pulse is checked.

The width L of the first digitized laser pulse 50 is too large and does not match the width of a digitized laser pulse hick may have generated the target laser spot. The first digitized laser pulse 50 corresponds to a specular highlight and is thus discarded.

The width of the second digitized laser pulse 51, the third digitized laser pulse 52 and the fourth digitized laser pulse 53 matches the width of a digitized laser pulse which may have generated the target laser spot.

The time of occurrence of the second digitized laser pulse 51 is dated and is timestamped t1. The time of occurrence of the third digitized laser pulse 52 is dated and is timestamped t2. The time of occurrence of the fourth digitized laser pulse 53 is dated and is timestamped t3.

Then, the following digitized pulses are detected.

The next second digitized laser pulse 51' is dated and is timestamped t5.

The next third digitized laser pulse 52' is dated and is timestamped t4 (it occurs before the next second digitized laser pulse 51').

The next fourth digitized laser pulse 53' is dated and is timestamped t6.

The period of time between the second laser pulse 51 and the next second laser pulse 51' does not correspond to a pulse repetition interval PRI associated with the target laser spot. The second laser pulse 51 and the next second laser pulse 51' (and the next second laser pulses) do not correspond to a target laser spot.

The period of time between the third laser pulse 52 and the third next laser pulse 52' does not correspond to a pulse repetition interval PRI associated with the target laser spot.

The period of time between the fourth laser pulse 53 and the next fourth laser pulse 53' does not correspond to a pulse repetition interval PRI associated with the target laser spot.

It can be seen that the period of time between a third laser pulse and a fourth consecutive laser pulse does not make it possible to read an image.

A larger time slot Fte is thus used to include the laser pulses in one single spatial image.

The laser spot detecting device 0 then uses the analog spatial output and implements an analysis by radiometry, or uses the spatial coherence of the trajectories to associate the laser pulses with the corresponding pixels and produce a valid spatial image.

Of course, the invention is not limited to the described embodiment but encompasses any alternative solution within the scope of the invention as defined in the claims.

Referring to FIG. 8, each elementary pulse detecting circuit 103 may well comprise, instead of the selector 25 and the memory module 26 described above, two "1 bit" memories 130 connected in series to the output of the comparator 117. In this case, the elementary pulse detecting circuit 103 has no mixed output but a digital output only, and the laser spot detecting device 100 comprises one digital output only (and no analog spatial output).

Each elementary pulse detecting circuit has an "open-drain output" implemented through a MOSFET transistor. "Open-drain output" here means a similar output implemented by a different transistor (for instance an open collector output using a bipolar transistor).

In the present description, "circuit" is to be understood as a set of interconnected components, with said components not necessarily being mounted on a separate integrated circuit card.

The invention claimed is:

1. A laser spot detecting device, comprising a matrix optical sensor having a plurality of elementary optoelectronic detectors each connected to a pulse detecting elementary circuit, with each pulse detecting elementary circuit comprising a comparator for comparing with a threshold an electrical quantity depending on an output current of the elementary optoelectronic detector applied to an input of the comparator and a memory module connected to an output of the comparator, with the memory modules being connected to a multiplexing circuit having an output forming a digital spatial output of the laser spot detecting device, characterized in that the laser spot detecting device further comprises a global OR circuit having inputs connected to the comparator outputs and having an output forming a real time digital temporal output of the laser spot detecting device.

2. The device according to claim 1, wherein the global OR circuit comprises a plurality of open drain transistors, with each open drain transistor being connected to an output of a comparator of one of the pulse detecting elementary circuits and forming an open drain output of this pulse detecting elementary circuit.

3. The device according to claim 2, wherein the open drain outputs of the pulse detecting elementary circuits connected to the elementary optoelectronic detectors located on a same line of the matrix sensor are connected together for summing said open drain outputs, and thus form a line signal (S1).

4. The device according to claim 3, wherein the global OR circuit further comprises components arranged for summing together the line signals and thus form the temporal output of the spot laser detecting device.

5. The device according to claim 1, wherein an input of the comparator of each pulse detecting elementary circuit is connected to the memory module, and wherein the output of the multiplexing circuit also forms an analog spatial output of the detecting device.

6. The device according to claim 5, wherein each memory module includes a first memory and a second memory.

7. The device according to claim 6, wherein each pulse detecting elementary circuit further comprises a selector having as inputs the comparator input and the comparator output and having an output connected to the first memory and to the second memory.

8. The device according to claim 6, wherein the first memory and/or the second memory comprise(s) a sample and hold circuit.

9. A method for detecting a laser spot implemented by a laser spot detecting device according to claim 1, with said method for detecting a laser spot comprising a verification step in which the temporal output of the laser spot detecting device is used for determining a duration of a laser pulse and/or a period of time between two successive laser pulses.

10. The detection method according to claim 9, wherein the duration of a laser pulse and/or the period of time between two successive laser pulses is/are used to verify that the laser pulse actually corresponds to a target laser spot.

11. The method according to claim 9, wherein, as the device is provided with an analog spatial output, the analog spatial output is used when several digitized laser pulses have a consistent width and a consistent length between two successive digitized pulses for radiometry discriminating for distinguishing the valid digitized laser pulses and the parasitic digitized laser pulses.

12. The method according to claim 9, with each memory module having a first memory and a second memory each comprising a sample and hold circuit, with each pulse detecting elementary circuit further comprising a selector having as inputs the comparator input and the comparator output and having an output connected to the first memory and to the second memory, with the sample and hold circuits being controlled for storing the either digital or analog laser pulses.

* * * * *